United States Patent
Tanimoto et al.

(10) Patent No.: US 6,514,426 B2
(45) Date of Patent: *Feb. 4, 2003

(54) PIEZOELECTRIC CERAMIC COMPOSITION AND PIEZOELECTRIC ELEMENT

(75) Inventors: Ryosuke Tanimoto, Omihachiman (JP); Yoichi Tsuji, Yokaichi (JP); Masanori Kimura, Omihachiman (JP); Hitoshi Takagi, Omihachiman (JP)

(73) Assignee: Murata Manufacturing Co. Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/933,410

(22) Filed: Aug. 20, 2001

(65) Prior Publication Data

US 2002/0043642 A1 Apr. 18, 2002

(30) Foreign Application Priority Data

Aug. 25, 2000 (JP) .......................................... 2000-256435

(51) Int. Cl.$^7$ ...................... B04B 35/462; B04B 35/472; B04B 35/48; B04B 35/49; B04B 35/491
(52) U.S. Cl. ............................... 252/62.9 PZ; 501/134; 501/154
(58) Field of Search .................... 252/62.9 PZ; 501/134, 501/154

(56) References Cited

FOREIGN PATENT DOCUMENTS

DE     100 41 905     * 3/2001

* cited by examiner

*Primary Examiner*—Elizabeth D. Wood
(74) *Attorney, Agent, or Firm*—Dickstein, Shapiro, Morin & Oshinsky, LLP.

(57) ABSTRACT

A piezoelectric ceramic composition and a piezoelectric element in which cracks and chips are not likely to occur during working even if the thicknesses are reduced, are provided. The piezoelectric ceramic composition contains as a primary component, a complex oxide having a perovskite structure, composed of at least Pb, Zr, Ti, Mn, Nb and O, and represented by general formula $ABO_3$, in which the total molar quantity of elements constituting A is smaller than the total molar quantity of elements constituting B, and Si is present as a secondary component at the content of about 0.010 wt % to 0.090 wt %, in terms of $SiO_2$, relative to the primary component.

10 Claims, No Drawings

PIEZOELECTRIC CERAMIC COMPOSITION AND PIEZOELECTRIC ELEMENT

BACKGROUND OF THE INVENTION

1. Field of the Invention

The present invention relates to a piezoelectric ceramic composition and a piezoelectric element composed of the piezoelectric ceramic composition.

2. Description of the Related Art

Piezoelectric ceramic compositions have hitherto been widely used as materials for piezoelectric elements, for example, piezoelectric vibrators, piezoelectric resonators, piezoelectric filters and piezoelectric oscillators. The piezoelectric ceramic compositions have been required to have varying characteristics depending on the end use application. For example, regarding oscillators, Qm values of the piezoelectric ceramic compositions are required to be high in order to oscillate and temperature coefficients of frequencies are required to be even in order to maintain reliability.

Regarding a conventional piezoelectric ceramic composition, in Japanese Examined Patent Application Publication No. 47-9185, disclosed as a $Pb\{(Mn_{1/3}Nb_{2/3})ZrTi\}O_3$—based material having a perovskite structure and represented by a general chemical formula $ABO_3$ is $Pb(Mn_{1/3} Nb_{2/3})O_3$—$PbTiO_3$—$PbZrO_3$, to which small quantities of at least one oxide selected from the group consisting of $MnO_2$, CoO and NiO was added.

In order to meet high frequencies, the reduction of piezoelectric element thickness has been accelerated. As a consequence, the requirements for high strength materials in which cracks and chips are not likely to occur during working, even if the thicknesses are reduced, have been intensified.

However, a $Pb\{(Mn_{1/3}Nb_{2/3})ZrTi\} O_3$—based material in which the quantity of Pb in A site of the perovskite formula is stoichiometric, the Pb amount is 1.00 mol, so that the flexural strength is as low as 110 to 130 MPa. Therefore, fracture is likely to occur due to shocks during the work of reducing thickness or making an element.

SUMMARY OF THE INVENTION

Accordingly, it is an object of the present invention to provide a piezoelectric ceramic composition and a piezoelectric element having superior shock resistance in which cracks and chips are not likely to occur during working, even if the thicknesses are reduced.

In order to achieve the aforementioned objects, according to a first aspect of the present invention, a piezoelectric ceramic composition containing a complex oxide having a perovskite structure, as a primary component, which is composed of at least Pb, Zr, Ti, Mn, Nb and O, and is represented by a general chemical formula $ABO_3$, is provided. In the piezoelectric ceramic composition, the total molar quantity of elements constituting A in the aforementioned formula representing the primary component is smaller than the total molar quantity of elements constituting B in the formula representing the primary component, and Si is added as a secondary component with the content of about 0.010 wt % to 0.090 wt %, in terms of $SiO_2$, relative to the primary component.

In the piezoelectric ceramic composition, the ratio of the total molar quantity of elements constituting A in the formula representing the primary component to the total molar quantity of elements constituting B in the formula representing the primary component is preferably about 0.985 to 0.998.

The piezoelectric ceramic composition according to the aforementioned configuration has a flexural strength of about 150 MPa or more, and even if the thickness is reduced, cracks and chips are not likely to occur during working.

According to a second aspect of the present invention, a piezoelectric ceramic composition represented by a compositional formula $Pb_a \{(Mn_{1/3}Nb_{2/3})_x Zr_y Ti_z\}O_3$+b wt % $MnO_2$ +c wt % $SiO_2$, is provided, wherein a, b, c, x, y and z are $0.985 \leq a \leq 0.998$, $0.155 \leq b \leq 0.500$, $0.010 \leq c \leq 0.090$, $0.045 \leq x \leq 0.200$, $0.290 \leq y \leq 0.425$, $0.475 \leq z \leq 0.580$ and $x+y+z=1$.

The piezoelectric ceramic composition according to the aforementioned configuration has a flexural strength of about 150 MPa or more, and has a Qm value necessary for piezoelectric vibrators, piezoelectric resonators, piezoelectric filters, piezoelectric oscillators, etc. Furthermore, an arbitrary temperature coefficient of resonant frequency can be achieved.

According to a third aspect of the present invention, a piezoelectric element is provided with a base material composed of the aforementioned piezoelectric ceramic composition and electrodes formed on the top and bottom faces of the base material.

DESCRIPTION OF THE PREFERRED EMBODIMENTS

Embodiments of the piezoelectric ceramic composition and the piezoelectric element according to the present invention will be explained below.

A piezoelectric ceramic composition according to the present invention contains a complex oxide having a perovskite structure, as a primary component, which is composed of lead oxide, titanium oxide, zirconium oxide, manganese carbonate, niobium oxide, silicon oxide, etc., and represented by the general formula $ABO_3$.

To prepare the composition, lead oxide, titanium oxide, zirconium oxide, manganese carbonate, niobium oxide and silicon oxide were blended in order to have a composition represented by the compositional formula $$Pb_a\{(Mn_{1/3}Nb_{2/3})_x Zr_y Ti_z\}O_3 + b \text{ wt \% } MnO_2 + c \text{ wt \% } SiO_2$$

wherein a, b, c, x, y and z were as shown in Table 1. In a preferred embodiment, $0.985 \leq a \leq 0.998$, $0.155 \leq b \leq 0.500$, $0.010 \leq c \leq 0.090$, $0.045 \leq x \leq 0.200$, $0.290 \leq y \leq 0.425$, $0.475 \leq z \leq 0.580$, and $x+y+z=1$.

TABLE 1

| Sample No. | Pb (a) | $Mn_{1/3}Nb_{2/3}$ (x) | Zr (y) | Ti (z) | Mn (b) | Si (c) | Flexural Strength (MPa) | Qm | fr-TC (%) |
|---|---|---|---|---|---|---|---|---|---|
| 1* | 0.980 | 0.100 | 0.375 | 0.525 | 0.410 | 0.030 | 150 | 1500 | −38 |
| 2 | 0.985 | 0.100 | 0.375 | 0.525 | 0.410 | 0.030 | 195 | 1300 | −33 |

TABLE 1-continued

| Sample No. | Pb (a) | $Mn_{1/3}Nb_{2/3}$ (x) | Zr (y) | Ti (z) | Mn (b) | Si (c) | Flexural Strength (MPa) | Qm | fr-TC (%) |
|---|---|---|---|---|---|---|---|---|---|
| 3 | 0.998 | 0.100 | 0.375 | 0.525 | 0.410 | 0.030 | 160 | 1150 | −5 |
| 4# | 1.000 | 0.100 | 0.375 | 0.525 | 0.410 | 0.030 | 130 | 1150 | −15 |
| 5# | 1.050 | 0.100 | 0.375 | 0.525 | 0.410 | 0.030 | 110 | 1150 | −5 |
| 6# | 0.990 | 0.100 | 0.375 | 0.525 | 0.410 | 0.000 | 140 | 1300 | −28 |
| 7 | 0.990 | 0.100 | 0.375 | 0.525 | 0.410 | 0.010 | 160 | 1300 | −28 |
| 8 | 0.990 | 0.100 | 0.375 | 0.525 | 0.410 | 0.090 | 200 | 1400 | −32 |
| 9* | 0.990 | 0.100 | 0.375 | 0.525 | 0.410 | 0.100 | 200 | 1200 | −31 |
| 10* | 0.990 | 0.100 | 0.375 | 0.525 | 0.150 | 0.030 | 180 | 300 | −45 |
| 11 | 0.990 | 0.100 | 0.375 | 0.525 | 0.155 | 0.030 | 180 | 500 | −45 |
| 12 | 0.990 | 0.100 | 0.375 | 0.525 | 0.500 | 0.030 | 205 | 500 | −40 |
| 13* | 0.990 | 0.100 | 0.375 | 0.525 | 0.505 | 0.030 | 200 | 300 | −50 |
| 14* | 0.990 | 0.100 | 0.430 | 0.470 | 0.410 | 0.030 | 190 | 950 | 119 |
| 15 | 0.990 | 0.100 | 0.425 | 0.475 | 0.410 | 0.030 | 190 | 1000 | 89 |
| 16 | 0.990 | 0.100 | 0.320 | 0.580 | 0.410 | 0.030 | 200 | 1500 | −88 |
| 17* | 0.990 | 0.100 | 0.315 | 0.585 | 0.410 | 0.030 | 200 | 1300 | −102 |
| 18* | 0.990 | 0.040 | 0.425 | 0.535 | 0.410 | 0.030 | 175 | 750 | 110 |
| 19 | 0.990 | 0.045 | 0.425 | 0.530 | 0.410 | 0.030 | 175 | 750 | 81 |
| 20 | 0.990 | 0.200 | 0.290 | 0.510 | 0.410 | 0.030 | 200 | 1200 | −85 |
| 21* | 0.990 | 0.205 | 0.285 | 0.510 | 0.410 | 0.030 | 200 | 1200 | −103 |
| 22 | 0.990 | 0.200 | 0.325 | 0.475 | 0.410 | 0.030 | 200 | 1300 | −95 |
| 23* | 0.990 | 0.205 | 0.320 | 0.475 | 0.410 | 0.030 | 200 | 1400 | −110 |
| 24 | 0.990 | 0.130 | 0.290 | 0.580 | 0.410 | 0.030 | 185 | 950 | −84 |
| 25* | 0.990 | 0.130 | 0.285 | 0.585 | 0.410 | 0.030 | 185 | 1000 | −105 |
| 26 | 0.990 | 0.045 | 0.375 | 0.580 | 0.410 | 0.030 | 175 | 800 | 75 |
| 27* | 0.990 | 0.040 | 0.375 | 0.585 | 0.410 | 0.030 | 175 | 800 | 102 |

The blended powder was wet-mixed using a ball mill for 7 to 11 hours, and thereafter, dehydrated, dried and calcined at 900° C. to 1,000° C. for 2 hours. The resulting calcined powder, to which an appropriate quantity of binder was added, was wet-mixed again using a ball mill for 10 to 15 hours, and was dehydrated so as to produce a powder for pressure molding. The resulting powder for pressure molding was pressure-molded into the shape of a rectangular plate, and was baked at 1,100° C. to 1,250° C. for 4 hours in air so as to produce a sintered material.

The resulting sintered material was cut into a slip of 6.7 mm by 30 mm by 0.260 mm, and thereafter, was polished in order to have the thickness of 0.210 mm, and the flexural strength (MPa) was measured.

Regarding electric characteristics, the sintered material produced by baking was polished and electrodes were formed. Subsequently, a ceramic material was produced by polarization in oil with 2.5 to 3.5 kV/mm. The polarized ceramic was seasoned at 150° C. for an hour. Thereafter, the resulting ceramic was cut into a slip and electrodes were formed on both faces thereof. This was cut into an element of 6.7 mm by 1.6 mm by 0.210 mm, and the electric characteristic Qm in a thickness shear vibration mode and the temperature change rate of resonant frequency (%) fr-TC at −20° C. to 80° C. were measured. The results thereof are shown in Table 1. In Table 1, sample numbers marked with # indicate samples which are out of the scope of the present invention, and sample numbers marked with an asterisk indicate samples which are within the scope of the present invention, but do not satisfy all the values in compositional formulae 1 described below.

In Sample Nos. 4 and 5, the total molar quantities a of the lead constituting A in the aforementioned perovskite formula, were equivalent to or more than the total molar quantities (that is, x+y+z, as shown in Table 1) 1 of the elements constituting $(Mn_{1/3}Nb_{2/3})_xZr_yTi_z$, that is, B in the formula. Therefore, the flexural strengths were less than 150 MPa, and these Samples are out of the scope of the present invention.

Also in Sample Nos. 4 and 5, the total molar quantities a of the elements constituting A in the chemical formula, that is, $Pb_a$, exceeded 0.998. Since the flexural strengths were less than 150 MPa, these samples were not suitable as piezoelectric ceramic compositions.

In Sample No. 6, the addition quantity of $SiO_2$, that is, c wt % in the compositional formula, was less than 0.010 wt %. Therefore, the flexural strength was less than 150 MPa, and this Sample was not suitable as a piezoelectric ceramic composition.

On the other hand, Sample Nos. 2, 3, 7, 8, 11, 12, 15, 16, 19, 20, 22, 24 and 26, had a, b, c, x, y and z which satisfied the preferred compositional formula $Pb_a\{(Mn_{1/3}Nb_{2/3})_xZr_yTi_z\}O_3+b$ wt % $MnO_2+c$ wt % $SiO_2$.

These Sample Nos. 2, 3, 7, 8, 11, 12, 15, 16, 19, 20, 22, 24 and 26 had the flexural strengths of 150 MPa or more, and had the Qm values necessary for piezoelectric resonators, piezoelectric vibrators, piezoelectric filters and piezoelectric oscillators.

In Sample No. 1, the total molar quantity a of the elements constituting A in the chemical formula, that is, $Pb_a$, was less than 0.985. Therefore, the flexural strength was relatively low as 150 MPa.

In Sample No. 9, the addition quantity of $SiO_2$, that is, c wt %, exceeded 0.090 wt %. Therefore, this Sample had superior flexural strength and superior Qm value, although the sintering temperature was increased, and the compositional ratio of the piezoelectric ceramic composition was not controlled with ease due to vaporization of Pb during baking.

The addition quantities of $MnO_2$ in Sample Nos. 10 and 13, that is, b wt % in the compositional formula, were less than 0.155 wt % or exceeded 0.500 wt %.

Therefore, the Qm values were low, and characteristics necessary for piezoelectric resonators could not be achieved.

As to Sample Nos. 18 and 27, since the total molar quantities x of the elements constituting $(Mn_{1/3}Nb_{2/3})_x$ were less than 0.045, the values of fr-TC were large, and regarding Sample Nos. 21 and 23, since the total molar quantities x of the elements constituting $(Mn_{1/3}Nb_{2/3})_x$ exceeded 0.200, the values of fr-TC were small. Therefore, characteristics necessary for piezoelectric resonators, piezoelectric vibrators, piezoelectric filters, and piezoelectric oscillators could not be achieved with these Samples.

In Sample Nos. 21 and 25, since the total molar quantities y of the elements constituting $Zr_y$ were less than 0.290, the values of fr-TC were small, and in Sample No. 14, since the total molar quantity y of the elements constituting $Zr_y$ exceeded 0.425, the value of fr-TC was large. Therefore, characteristics necessary for piezoelectric resonators, piezoelectric vibrators, piezoelectric filters and piezoelectric oscillators could not be achieved with these Samples.

As to Sample No. 14, since the total molar quantity z of the elements constituting $Ti_z$ was less than 0.475, the value of fr-TC was large, and in Sample Nos. 17, 25 and 27, since the total molar quantities z of the elements constituting $Ti_z$ exceeded 0.580, the values of fr-TC were small. Therefore, characteristics necessary for piezoelectric resonators, piezoelectric vibrators, piezoelectric filters, and piezoelectric oscillators could not be achieved.

By making the total molar quantity a of the elements constituting $Pb_a$, that is, A in the aforementioned chemical formula, smaller than the total molar quantity (that is, x+y+z, as shown in Table 1) 1 of the elements constituting $(Mn_{1/3}Nb_{2/3})_x Zr_y Ti_z$, that is, B in the $ABO_3$ formula, and by making the addition quantity of $SiO_2$, that is, c wt %, fall within the range of about 0.010 wt % or more, but about 0.090 wt % or less, a piezoelectric ceramic composition having flexural strength of 150 MPa or more can be produced.

When the total molar quantity a of the elements constituting $Pb_a$, that is, A in the formula, is about 0.985 or more, but about 0.998 or less, a piezoelectric ceramic composition having a flexural strength of 150 MPa or more can be produced.

When the addition quantity of $MnO_2$, that is, b wt %, is 0.155 wt % or more, but 0.500 wt % or less, the Qm value is high and characteristics necessary for a piezoelectric resonator can be achieved.

When the total molar quantity x of the elements constituting $(Mn_{1/3}Nb_{2/3})_x$ is 0.045 or more but 0.200 or less, the total molar quantity y of the elements constituting $Zr_y$ is 0.290 or more but 0.425 or less, and the total molar quantity z of the elements constituting $Ti_z$ is 0.475 or more but 0.580 or less, the value of fr-TC is appropriate, and characteristics necessary for piezoelectric resonators, piezoelectric vibrators, piezoelectric filters and piezoelectric oscillators can be achieved.

The piezoelectric ceramic composition and the piezoelectric element according to the present invention are not limited to the aforementioned embodiments, and variously modified configurations can be applied in the scope of the present invention.

For example, small quantities of Sr, Nd, La and Ba may substitute for the Ph at site A in the formula. Furthermore, very small quantities of Al, Fe, Cl, etc., may be present as incidental impurities.

As is clear from the above description, a piezoelectric ceramic composition in which cracks and chips are not likely to occur during working, even if the thickness is reduced, can be provided according to the present invention. In particular, the piezoelectric ceramic composition has a Qm value necessary for piezoelectric vibrators, piezoelectric resonators, piezoelectric filters, piezoelectric oscillators, etc., and an arbitrary temperature coefficient of resonant frequency can be achieved, so that the piezoelectric ceramic composition is most suitable as a material for a piezoelectric element.

What is claimed is:

1. A piezoelectric ceramic composition comprising a complex oxide comprising Pb, Zr, Ti, Mn, Nb and O and having a perovskite structure represented by the formula $ABO_3$, as a primary component, wherein the total molar quantity of elements constituting A in said formula is smaller than the total molar quantity of elements constituting B in said formula, and Si at a content of about 0.010 wt % to 0.090 wt %, in terms of $SiO_2$, relative to said primary component, as a secondary component.

2. A piezoelectric ceramic composition according to claim 1, wherein the ratio of the total molar quantity of elements constituting A to the total molar quantity of elements constituting B is about 0.985 to 0.998.

3. A piezoelectric ceramic composition according to claim 1 and represented by the compositional formula

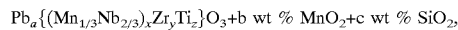

$Pb_a\{(Mn_{1/3}Nb_{2/3})_x Zr_y Ti_z\}O_3$ +b wt % $MnO_2$ +c wt % $SiO_2$, wherein $0.985 \leq a \leq 0.998$, $0.155 \leq b \leq 0.500$, $0.010 \leq c \leq 0.090$, $0.045 \leq x \leq 0.200$, $0.290 \leq y \leq 0.425$, $0.475 \leq z \leq 0.580$, and x+y+z=1.

4. A piezoelectric ceramic composition according to claim 1 in which the elements constituting A is a combination of Pb and at least one member selected from the group consisting of Sr, Nb, La and Ba.

5. A piezoelectric ceramic composition according to claim 1 in which the elements constituting A is Pb.

6. A piezoelectric element comprising a base material comprising a piezoelectric ceramic composition according to claim 5, and a pair of electrodes at different points on the external surface of the base material of said base material.

7. A piezoelectric element comprising a base material comprising a piezoelectric ceramic composition according to claim 4, and a pair of electrodes at different points on the external surface of the base material of said base material.

8. A piezoelectric element comprising a base material comprising a piezoelectric ceramic composition according to claim 3, and a pair of electrodes at different points on the external surface of the base material of said base material.

9. A piezoelectric element comprising a base material comprising a piezoelectric ceramic composition according to claim 2, and a pair of electrodes at different points on the external surface of the base material of said base material.

10. A piezoelectric element comprising a base material comprising a piezoelectric ceramic composition according to claim 1, and a pair of electrodes at different points on the external surface of the base material of said base material.

* * * * *